United States Patent [19]

Lodi

[11] 4,122,545
[45] Oct. 24, 1978

[54] MEMORY ARRAY OF INVERSION CONTROLLED SWITCHES

[75] Inventor: Robert J. Lodi, Tewksbury, Mass.

[73] Assignee: Sperry Rand Corporation, New York, N.Y.

[21] Appl. No.: 866,573

[22] Filed: Jan. 3, 1978

[51] Int. Cl.² ............................................. G11C 11/40
[52] U.S. Cl. ................................... 365/186; 307/238; 365/175
[58] Field of Search ................ 307/238; 365/174, 175, 365/180, 186

[56] References Cited

U.S. PATENT DOCUMENTS

| 3,796,931 | 3/1974 | Maute | 365/175 |
| 3,949,243 | 4/1976 | Sander et al. | 365/186 |
| 3,979,613 | 9/1976 | Kroger | 307/304 |

*Primary Examiner*—Stuart N. Hecker
*Attorney, Agent, or Firm*—Howard P. Terry; Eugene L. Flanagan, III

[57] ABSTRACT

The present invention relates to a memory circuit including an array of inversion controlled switches arranged in an arbitrary number of rows and columns. Each inversion controlled switch is provided with emitter, base and collector terminals, and is characterized by first and second impedance states between its emitter and collector terminals. The memory circuit further includes voltage means coupled with the inversion controlled switches of the array for applying a selectively controllable voltage across the emitter and collector terminals of these switches in selected ones of the rows; a plurality of rectifier means each coupled with the base terminal of a respective inversion controlled switch; current means coupled with the rectifier means for applying a current level to the base terminals of the inversion controlled switches in selected ones of the columns through the rectifier means; and data sensing means coupled with the inversion controlled switches in individual ones of the columns for sensing the impedance state of a selected one of the switches in a respective one of the columns.

4 Claims, 3 Drawing Figures

MEMORY ARRAY OF INVERSION CONTROLLED SWITCHES

BACKGROUND OF THE INVENTION

The present invention relates generally to memory circuits utilizing inversion controlled switches; more particularly, the present invention is directed to a novel inversion controlled switch memory array providing superior device-to-device isolation.

The inversion controlled switch is described in U.S. Pat. No. 3,979,613 to Harry Kroger and assigned to Sperry Rand Corporation. A three terminal inversion controlled switch is described therein in which the emitter-collector impedance exhibits bistable states achieved and maintained through the control of emitter-collector voltage with or without control of the base current.

It has been proposed to construct a memory array of inversion controlled switches arranged in rows and columns whereby a controllable voltage may be applied to individual columns of switches at their collector electrodes while a controllable current is applied to individual rows of switches through their base terminals. By coupling the base terminals of each row of switches to a common current source, it is difficult to prevent current from flowing between devices, such that the threshold voltage levels of switches within each row may be uncontrollably and adversely affected. Under certain operating conditions, it is possible for a device in a high impedance or OFF state to be incorrectly switched to a low impedance or ON state by sinking current from another switch in the row that is ON.

SUMMARY OF THE INVENTION

In accordance with the present invention, a memory circuit comprises an array of inversion controlled switch means of N rows by M columns, each said switch means having emitter, base and collector terminals, and characterized by first and second discrete impedance states between the emitter and collector terminals thereof; voltage means coupled with said switch means for applying a selectably controllable voltage level across the emitter and collector terminals of said switch means in selected ones of said rows thereof; a plurality of rectifier means each coupled with the base terminal of a respective switch means; current means coupled with said rectifier means for applying a current level to the base terminals of said switch means in selected ones of said columns through said rectifier means; and data sensing means coupled with said switch means in individual ones of said columns thereof for sensing the impedance state of a selected one of said switch means in a respective one of said columns.

DESCRIPTION OF A PREFERRED EMBODIMENT

The inversion controlled switch is a device having at least two discrete impedance states and has either a metal/conductive-insulator/semiconductor PN junction or metal/conductive-insulator/semiconductor/barrier-emitter construction. The combination metal/conductive-insulator layer is regarded as a collector region while the semiconductor region adjacent to the conductive insulator layer is regarded as a base of the device. In the case of a PN junction type inversion controlled switch, the second semiconductor region adjacent the base is regarded as an emitter, whereas in the case of a semiconductor/barrier-emitter type inversion controlled switch, a metal layer disposed on a surface of the semiconductor base region opposite a surface of the base region adjacent to the conductive insulator layer, is regarded as an emitter. The inversion controlled switch exhibits at least two stable impedance states, one characterized by a high impedance between the collector and emitter regions and the other characterized by a low impedance between the collector and emitter regions. In the high impedance state, a deep depletion region forms in the base region adjacent the insulator layer, the deep depletion region existing so long as the conductive-insulator layer is able to prevent the build-up of an inversion layer in that portion of the base region adjacent thereto. The low impedance state is achieved when current from a strongly forward biased emitter-base junction overwhelms the capability of the conductive-insulator layer to discharge an incipient inversion layer. The presence of the inversion layer results in a relatively high electric field within the conductive-insulator layer enabling the conduction of a relatively high collector current.

Figure 1:
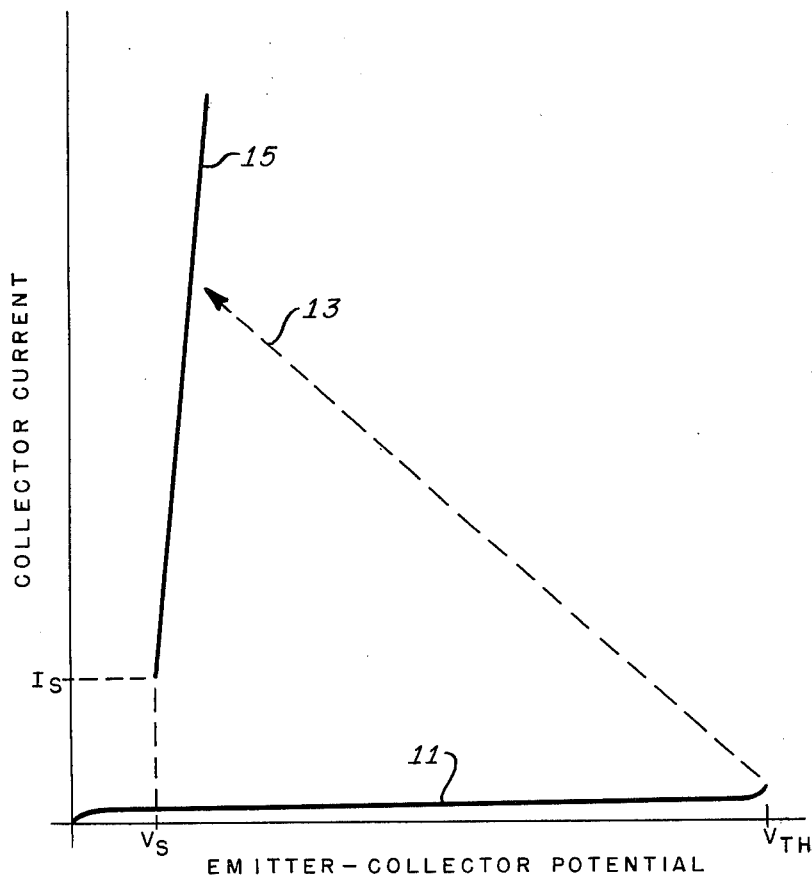
FIG. 1 is a graph of a typical relationship between emitter-collector potential and collector current in an inversion controlled switch.

FIG. 1 illustrates a typical relationship between emitter-collector potential and collector current in an inversion controlled switch. The horizontal axis of FIG. 1 represents the potential difference between the emitter and the collector of the device, the polarity of this potential being such as to forward bias the emitter-base junction, while the vertical axis represents the magnitude of current drawn from the collector of the device as a function of the emitter-collector potential. In the high impedance state, the collector current remains at a relaively low value, indicated by curve 11, until such time that the emitter-collector potential exceeds a threshold voltage value $V_{TH}$ at which the device switches to its low impedance state as indicated by arrow 13. In the low impedance state the collector current is an approximately linear function of emitter-collector potential, as indicated by curve 15. The device will remain in its low impedance state only so long as the collector current remains equal to or greater than a sustaining current level $I_S$ corresponding to a minimum emitter-collector potential, termed the sustaining voltage $V_S$. Should the collector current fall below the sustaining current value, the device will revert to its high impedance state.

Figure 2:
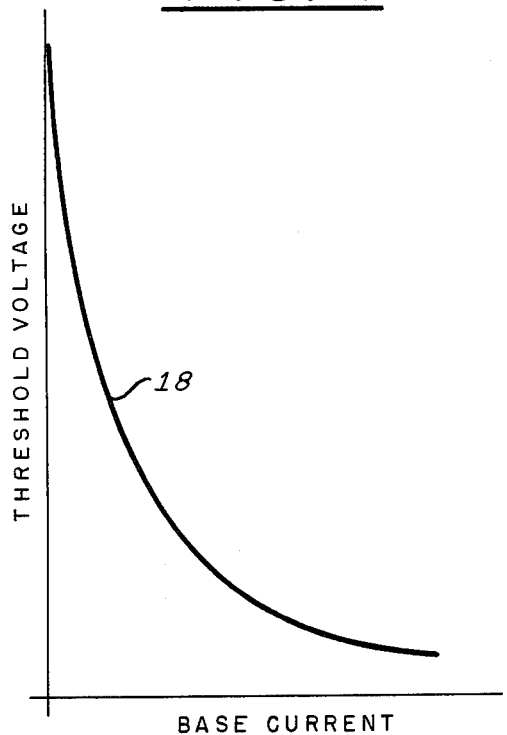
FIG. 2 is a graph of a typical relationship between base current and threshold voltage in an inversion control switch.

FIG. 2 illustrates a typical relationship between base current and threshold voltage in an inversion controlled switch. The horizontal axis of FIG. 2 represents the magnitude of current applied to the base of an inversion controlled switch, while the vertical axis represents its threshold voltage. It will be seen from FIG. 2 and curve 18 thereof that the threshold voltage decreases monotonically with an increase in the base current. The application of a base current to a device in the low impedance state has the effect of slightly increasing the sustaining voltage $V_S$, while the effect of base current upon the low impedance characteristics is otherwise minimal.

In a memory array of inversion controlled switches, it is necessary to be able to WRITE and READ information stored in selected individual switches. In such an array wherein such devices are arranged in rows $i$ and columns $j$ orthogonal thereto this capability may be achieved by the provision of means for applying selectably controllable voltage levels across the collector-emitter terminals of devices in selected individual rows of the array along with means for simultaneously applying a selectably controllable current level to the base terminals of devices in selected individual columns of the array. Information stored in a given row is then read by sensing a change in emitter or collector current in devices of a selected row resulting from a controlled change in the emitter-collector voltages thereof. However, it is possible for a device in a given column to draw current at its base terminal from the base of another device in the same column which is in its low impedance or ON state unless adequate device-to-device isolation is provided. Under adverse bias conditions, a device in its high impedance or OFF state may draw sufficient base current from an ON device such that the OFF device is erroneously and uncontrollably turned on. The present invention eliminates this possibility by precluding the flow of current from the base of one device in an array to the base of another device therein while permitting the simultaneous application of a base current to the devices in a given column of the array.

Figure 3:
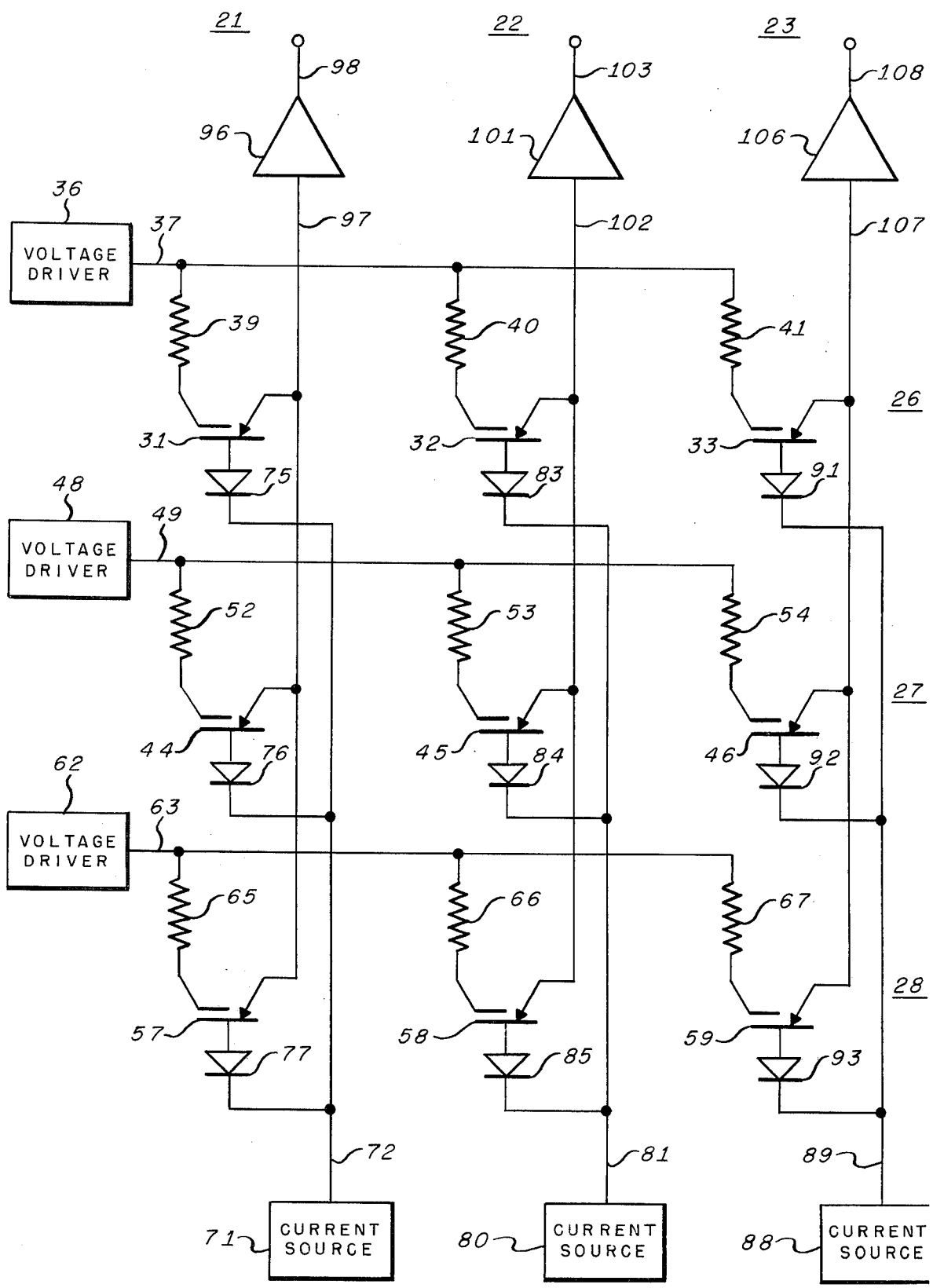
FIG. 3 is a schematic diagram, partially in block form, of a memory circuit in accordance with the present invention.

A preferred embodiment of a memory circuit in accordance with the present invention is illustrated in FIG. 3 in which a rectangular array of inversion controlled switches is arranged in columns 21, 22 and 23 and rows 26, 27 and 28, designated words, orthogonal to said columns. It will be readily apparent that the array of FIG. 3 may be selected to have an arbitrary number of columns N and rows M. Row 26 includes inversion controlled switches 31 (located in column 21), 32 (located in column 22), and 33 (located in column 23). A voltage driver 26 is associated with row 26 and is operative to provide a selectably controllable voltage level at an output terminal 37 thereof. Switches 31, 32, and 33 of row 26 have their collector terminals coupled to output terminal 37 of voltage driver 36 through respective load resistors 39, 40 and 41. Row 27 includes inversion controlled switches 44 (located in column 21), 45 (located in column 22) and 46 (located in column 23). Voltage driver 48 is associated with row 27 and is operative to provide a selectably controllable voltage level at an output terminal 49 thereof. Each of switches 44, 45 and 46 has its collector terminal coupled with output terminal 49 through respective load resistors 52, 53 and 54. Row 28 includes inversion controlled switches 57 (located in column 21), 58 (located in column 22), and 59 (located in column 23). Voltage driver 62 is associated with row 28 and is operative to provide a selectably controllable voltage level at an output terminal 63 thereof. Each of switches 57, 58 and 59 has its collector terminal coupled with output terminal 63 through respective load resistors 65, 66, and 67. A current source 71 is associated with column 21 and is provided with a current source terminal 72 which is coupled with the base terminals of switches 31, 44 and 57 through respective semiconductor diodes 75, 76 and 77, each having an anode terminal connected to the base terminal of its respective switch and a cathode terminal connected with current source terminal 72. Current source 71 is operative to apply a selectably controllable current level to the base terminals of switches 31, 44, and 57. Current source 80 is associated with column 22 and is provided with a current source terminal 81 which is coupled with the base terminals of each of switches 32, 45 and 58 through respective semiconductor diodes 83, 84 and 85. Diodes 83, 84 and 85 have their anode terminals connected respectively, to the base terminals of switches 32, 45 and 58, and their cathode terminals connected to current source terminal 81. Current source 80 is operative to apply a selectably controllable current level to the base terminals of switches 32, 45 and 58 through respective diodes 83, 84 and 85. Current source 88 is associated with column 23 and is provided with a current source terminal 89 which is coupled with the base terminals of switches 33, 46 and 59 through respective semiconductor diodes 91, 92 and 93. Each of diodes 91, 92 and 93 has an anode terminal connected to the base terminal of its respective one of switches 33, 46 and 59, and a cathode terminal connected with current source terminal 89. Current source 88 is operative to apply a selectably controllable current level to the base terminals of switches 33, 46 and 59 through respective diodes 91, 92 and 93.

A data sensing amplifier 96 is associated with column 21 and is provided with a data input terminal 97 connected to the emitter terminal of each of switches 31, 44 and 57 in column 21. Data sensing amplifier 96 has a data output terminal 98 at which a data output signal indicative to the impedance state of a selected one of switches 31, 44 and 57 can be provided. A data sensing amplifier 101 is associated with column 22 and is provided with a data input terminal 102 connected to the emitter terminal of each of switches 32, 45, and 58 in column 22. Data sensing amplifier 101 has a data output terminal 103 at which a data output signal indicative of the impedance of a selected one of switches 32, 45 and 58 can be provided. Data sensing amplifier 106 is associated with column 23 and is provided with a data input terminal 107 connected with the emitter terminal of each of switches 33, 46, and 59. Data sensing amplifier 106 has a data output terminal 108 at which a data output signal indicative of the impedance state of a selected one of switches 33, 46 and 59 can be provided.

In operation, information is written into the array of FIG. 3 by establishing the impedance states of selected individual switches either at a high (ON) or low (OFF) level. This operation is performed in two steps, namely a CLEAR step, followed by a WRITE step. The CLEAR step is performed by establishing one or more selected devices in an OFF state. If, for example, it is desired to store information in switch 31 of FIG. 3, the CLEAR operation would be performed either by disconnecting the collectors of all switches in row 26 from terminal 37 thus to interrupt the flow of collector current in all switches of row 26, or by establishing the voltage at terminal 37 at a value approximately equal to the voltage levels of terminals 97, 102, and 107. In either case the collector current in each of switches 31, 32, and 33 of row 26 is reduced below the sustaining current level $I_S$ such as that all of switches 31, 32, and 33 are established in the OFF state. Where it is desired to retain any of the information stored in row 26, auxiliary storage locations are provided to temporarily store the information from row 26 until the CLEAR operation has been completed. Then the second or WRITE operation is performed to establish the impedance state of each of switches 31, 32 and 33 as desired to store information therein in accordance with a predetermined data pattern. In accordance with the WRITE operation, selected ones of the switches in the cleared row are established in the ON state by the coincident application of a base current to those columns comprising these selected switches and a collector voltage to the cleared row which is greater than the threshold voltages established by the applied base currents but less than the threshold voltages of those devices to which no base current has been applied. It is, therefore, possible to select those devices of the cleared row which are to be written in the ON state by the application of a predetermined base current thereto. Accordingly, if it is desired to establish switch 31 in the ON state, and switches 32, and 33 in the OFF state, a predetermined base current will be supplied by current source 71 through diode 75 to the base of switch 31, while a substantially zero current level will be provided by current source 80 and current source 88 such that no base current is supplied to the base terminals of switch 32 and switch 33, respectively. Simultaneously, the voltage at terminal 37 will be raised by voltage driver 36 to a level above the threshold voltage level of switch 31 (which has been lowered by the application of a base current thereto) and below the threshold voltage levels of switches 31 and 33 (which are high since no base current has been applied to these switches). Consequently, switch 31 will be established in the ON state while switches 32 and 33 will remain in the OFF state established by the CLEAR operation previously performed. The WRITE operation is completed by reducing the collector potential of the devices so written to a level above the sustaining voltage level $V_S$ and well below the range of threshold voltage values that may be established in the devices of the array by varying the base currents thereof at such times that information is written in other rows of the array.

The CLEAR operation may be performed on only one selected switch of the array if means are provided for selectably controlling the emitter voltages in the individual columns of the array. Accordingly, in arrays comprising switches of the metal/conductive-insulator/n-type semiconductor/p-type semiconductor variety, such as the array of FIG. 3, a selected one of the devices therein may be cleared without affecting the impedance states of the other devices of the row, by reducing the emitter voltage of the interconnected emitters of the column of the selected switch to a value above the sustaining voltage level and simultaneously raising the collector voltage of the interconnected devices within the row of the selected switch to the value established for the interconnected emitters of said column such that the collector-emitter voltage of the selected switch is reduced below its sustaining voltage. However, since the collector voltages of the other switches of said column remain unchanged and the emitter voltages of the other switches of said row remain unchanged, it is thus possible to maintain their collector-emitter voltages above their sustaining voltage levels, such that only the selected switch will be cleared. It is, therefore, unnecessary to provide auxiliary storage locations to store the information from a cleared row since the impedance states of all but the selected switch are unaffected by the CLEAR operation.

However, it must be born in mind that an inversion controlled switch, which is a three terminal device, is capable of conducting current in two directions at its base terminal. It will be apparent, therefore, that selectively altering collector and emitter voltages as above will frequently result in the undesirable conduction of base current from one or more switches in a column of the array to others of such devices in that column. Through the provision of rectification means in the base circuit of each switch of the array, the rectification means being coupled to the base terminals in the same sense for all such interconnected base circuits, the conduction of base current between such interconnected devices can be eliminated, while it is possible to provide a base current from an external current source simultaneously to any number of interconnected base circuits in this manner.

Stored information may be read from a selected row of the array of FIG. 3 by controllably altering the voltage level applied to the collectors of the switches in that row. Accordingly, in the case of devices in that row which are ON, their emitter current level will be altered, while in the case of devices in that row which are OFF, any change in emitter current will be minimal. For example, if it is desired to read information stored in row 27, the voltage level provided to terminal 49 by voltage driver 48 is altered sufficiently to cause a detectable emitter current change in devices of row 27 which are ON. If, for example, switch 44 is ON, while switches 45 and 46 are OFF, a detectable emitter current change in switch 44 will be amplified by data sensing amplifier 96 and provided at data output terminal 98. However, since emitter current changes in switches 45 and 46 will be minimal, substantially no change in output signal levels at terminals 103 and 108 of data sensing amplifiers 101 and 106, respectively, will result. The change in collector voltage provided by voltage driver 48 is selected such that the threshold voltage levels of switches 44, 45, and 46 are not exceeded while the emitter-collector voltages of these switches are not decreased below their sustaining voltage values $V_S$, such that device impedance states are not altered during the READ operation. Accordingly, reading of the data from the array of FIG. 3 is non-destructive with no limit to the number of times a READ cycle can be performed.

From the foregoing it will be appreciated that the memory circuit of the present invention avoids the problem of device interactions whereby one or more inversion controlled switches in the array of the memory circuit, by drawing base current from other such devices of the array suffer undesirable and uncontrollable shifts in threshold voltage with the consequence that false information may be stored in the array. This is accomplished in the present invention with minimal power dissipation and, in one advantageous embodiment, through the use of semiconductor PN junction devices having relatively small device cross-sectional areas.

While the invention has been described in its preferred embodiments, it is to be understood that the words which have been used are words of description rather than limitation and that changes may be made within the purview of the appended claims without departing from the true scope and spirit of the invention in its broader aspects.

I claim:

1. A memory circuit, comprising:

an array of inversion controlled switch means of N rows by M columns, each said switch means having emitter, base and collector terminals, and characerized by first and second discrete impedance states between the emitter and collector terminals thereof;

voltage means coupled with said switch means for applying a selectably controllable voltage level across the emitter and collector terminals of said switch means in selected ones of said rows thereof;

a plurality of rectifier means each coupled with the base terminal of a respective switch means;

current means coupled with said rectifier means for applying a selectably controllable current level to the base terminals of said switch means in selected ones of said columns through said rectifier means; and data sensing means coupled with said switch means in individual ones of said columns thereof for sensing the impedance state of a selected one of said switch means in a respective one of said columns.

2. The memory circuit of claim 1, in which each said rectifying means is provided with a first terminal and a second terminal, the first terminal thereof being connected to the base terminal of said respective switch means and the second terminal thereof being connected to the second terminals of the others of said rectifying means in the corresponding column of said respective switch means and with said current means.

3. The memory circuit of claim 2 in which said data sensing means comprises a plurality of data sensing amplifiers each having an input and an output, and the emitter terminal of each said switch means is connected with the emitter terminals of the others of said switch means in the corresponding column thereof and to the input of a respective data sensing amplifier such that the application of a predetermined read voltage level across the emitter and collector terminals of said switch means in a selected one of said rows by said voltage means will provide a data output signal at the output of each said data sensing amplifier indicative of the impedance state of the switch means in the column corresponding to the respective data sensing amplifier and in the selected one of said rows.

4. The memory circuit of claim 2, further comprising a plurality of impedance means each coupled with the collector terminal of a respective one of said switch means, said voltage means being coupled with the collector terminals of said switch means in respective ones of said rows through said plurality of impedance means to apply a selectably controllable voltage level thereto.

* * * * *

UNITED STATES PATENT OFFICE
CERTIFICATE OF CORRECTION

Patent No. 4,122,545        Dated October 24, 1978

Inventor(s) Robert J. Lodi

It is certified that error appears in the above-identified patent and that said Letters Patent are hereby corrected as shown below:

In the specification, the following should be inserted after column 1, line 5:  --The Government has rights in this invention pursuant to Contract No. F19628-76-C-0105 awarded by the Department of the Air Force.--

Column 1, lines 64 and 65, that portion reading "inversion control switch" should read --inversion controlled switch--.

Column 3, line 44, that portion reading "voltage driver 26" should read  --voltage driver 36--.

Column 7, lines 3 and 4, "characerized" should read --characterized--.

Signed and Sealed this

Eighth Day of April 1980

[SEAL]

Attest:

SIDNEY A. DIAMOND

Attesting Officer

Commissioner of Patents and Trademarks